(12) United States Patent
Bejhed

(10) Patent No.: US 12,304,804 B2
(45) Date of Patent: May 20, 2025

(54) MICRO-ELECTRO-MECHANICAL SYSTEM FLUID CONTROL

(71) Applicant: Water Stuff & Sun GmbH, Unterschleissheim (DE)

(72) Inventor: Johan Bejhed, Uppsala (SE)

(73) Assignee: WATER STUFF & SUN GMBH, Unterschleissheim (DE)

( * ) Notice: Subject to any disclaimer, the term of this patent is extended or adjusted under 35 U.S.C. 154(b) by 0 days.

(21) Appl. No.: 18/568,850

(22) PCT Filed: Jun. 15, 2022

(86) PCT No.: PCT/EP2022/066267
§ 371 (c)(1),
(2) Date: Dec. 11, 2023

(87) PCT Pub. No.: WO2022/263491
PCT Pub. Date: Dec. 22, 2022

(65) Prior Publication Data
US 2024/0279048 A1    Aug. 22, 2024

(30) Foreign Application Priority Data
Jun. 16, 2021   (SE) .................................. 2150773-6

(51) Int. Cl.
*B81B 1/00*    (2006.01)
*F16K 99/00*   (2006.01)
(Continued)

(52) U.S. Cl.
CPC .......... *B81B 1/006* (2013.01); *F16K 99/0015* (2013.01); *G05D 7/005* (2013.01);
(Continued)

(58) Field of Classification Search
CPC .............. B81B 1/006; B81B 2201/054; B81B 2201/058; B81B 2201/10; B81B 2207/03;
(Continued)

(56) References Cited

U.S. PATENT DOCUMENTS 5,839,467 A    11/1998  Saaski et al.
2002/0007727 A1*  1/2002  Lafler .................. B60T 13/683
                                                           91/461
(Continued)

FOREIGN PATENT DOCUMENTS

DE    4422943 A1    1/1996
SE    535472 C2    8/2012
(Continued)

OTHER PUBLICATIONS

International Search Report and Written Opinion mailed on Jun. 15, 2022, received for PCT Application PCT/EP2022/066267, filed on Oct. 5, 2022, 12 pages.
(Continued)

*Primary Examiner* — Minh Q Le
(74) *Attorney, Agent, or Firm* — XSENSUS LLP

(57)  ABSTRACT

A fluid-control device comprises a stack of wafers in which flow components are provided as micro-electro-mechanical systems—MEMS. The flow components are selected from fluid-control components and/or fluid-monitor components. The fluid-control device has a first flow component that is encircled, in a main plane of the stack of wafers, by a second flow component.

20 Claims, 11 Drawing Sheets

(51) Int. Cl.
*G05D 7/00* (2006.01)
*B81B 3/00* (2006.01)
*B81B 7/04* (2006.01)
*G05D 16/06* (2006.01)

(52) U.S. Cl.
CPC ............... *B81B 3/0018* (2013.01); *B81B 7/04* (2013.01); *B81B 2201/054* (2013.01); *B81B 2201/058* (2013.01); *B81B 2201/10* (2013.01); *B81B 2203/0338* (2013.01); *B81B 2207/03* (2013.01); *F16K 99/0005* (2013.01); *F16K 2099/008* (2013.01); *G05D 7/00* (2013.01); *G05D 16/06* (2013.01)

(58) Field of Classification Search
CPC . B81B 2203/0338; B81B 3/0018; B81B 7/04; B81B 7/00; F16K 99/0015; F16K 99/0005; F16K 2099/008; G05D 7/005; G05D 7/00; G05D 16/06
USPC .......................................... 137/501; 251/331
See application file for complete search history.

(56) References Cited

U.S. PATENT DOCUMENTS

| | | | |
|---|---|---|---|
| 2006/0194331 A1* | 8/2006 | Pamula | B81B 3/0021 422/400 |
| 2008/0283123 A1 | 11/2008 | Stenmark | |
| 2009/0315126 A1 | 12/2009 | McAvoy et al. | |
| 2010/0288382 A1* | 11/2010 | Levent | F04B 43/14 137/565.26 |
| 2011/0300034 A1* | 12/2011 | Mair | B01L 3/502707 156/245 |
| 2011/0305607 A1 | 12/2011 | Jung et al. | |
| 2017/0176277 A1 | 6/2017 | Tokuda | |
| 2017/0184556 A1 | 6/2017 | Toffoli et al. | |
| 2018/0319655 A1* | 11/2018 | Clark | B01L 3/502707 |
| 2020/0061614 A1* | 2/2020 | Komori | B01L 3/502715 |
| 2021/0088155 A1 | 3/2021 | Lu et al. | |
| 2021/0347634 A1* | 11/2021 | Giusti | H04R 7/04 |
| 2022/0105510 A1* | 4/2022 | O'Boyle | C12M 41/40 |
| 2022/0136618 A1* | 5/2022 | Wehner | F16K 99/0057 251/61.1 |
| 2022/0241785 A1* | 8/2022 | Solczynski | B81C 1/00119 |
| 2022/0362804 A1* | 11/2022 | Chiu | B81C 1/00158 |

FOREIGN PATENT DOCUMENTS

| | | |
|---|---|---|
| WO | 2008/066485 A1 | 6/2008 |
| WO | 2010/047648 A1 | 4/2010 |
| WO | 2013/090197 A1 | 6/2013 |
| WO | 2015/060721 A1 | 4/2015 |

OTHER PUBLICATIONS

Eric Chappel, "A Review of Passive Constant Flow Regulators for Microfluidic Applications", Applied Sciences, vol. 10, No. 24, 8858, Dec. 10, 2020, pp. 1-29.

* cited by examiner

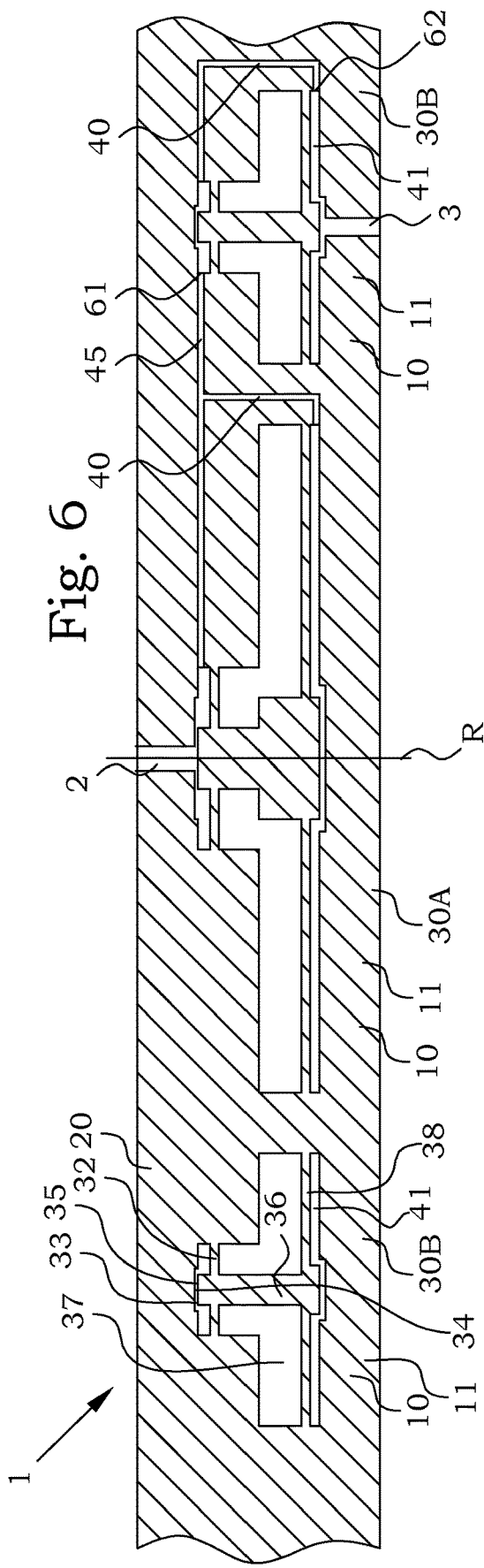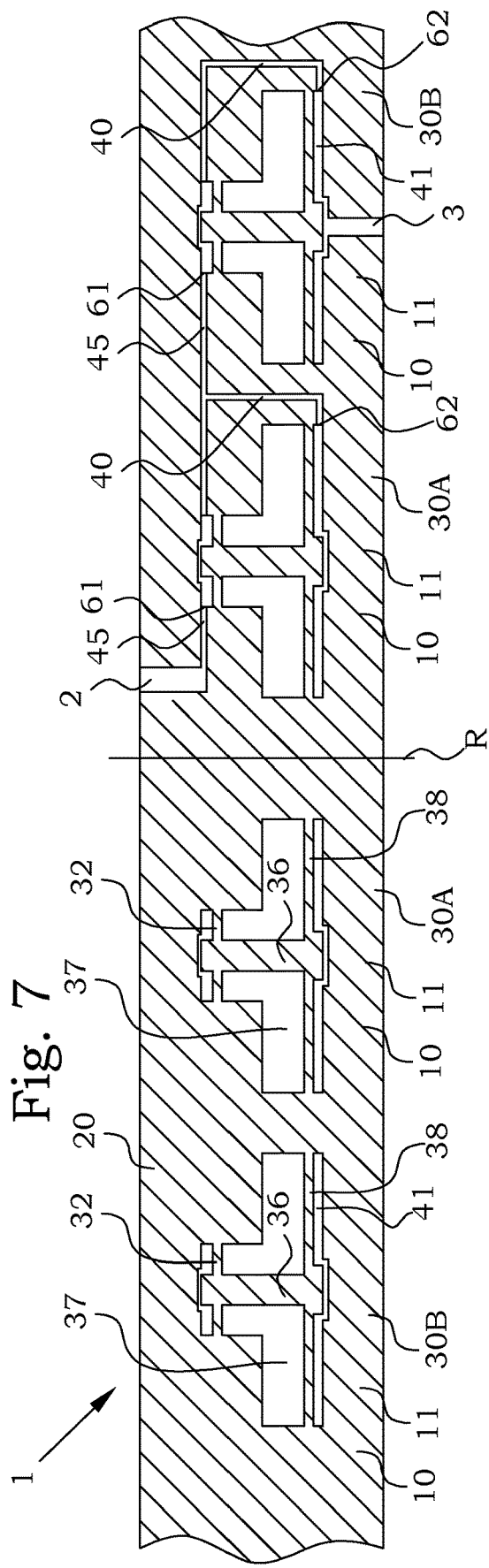

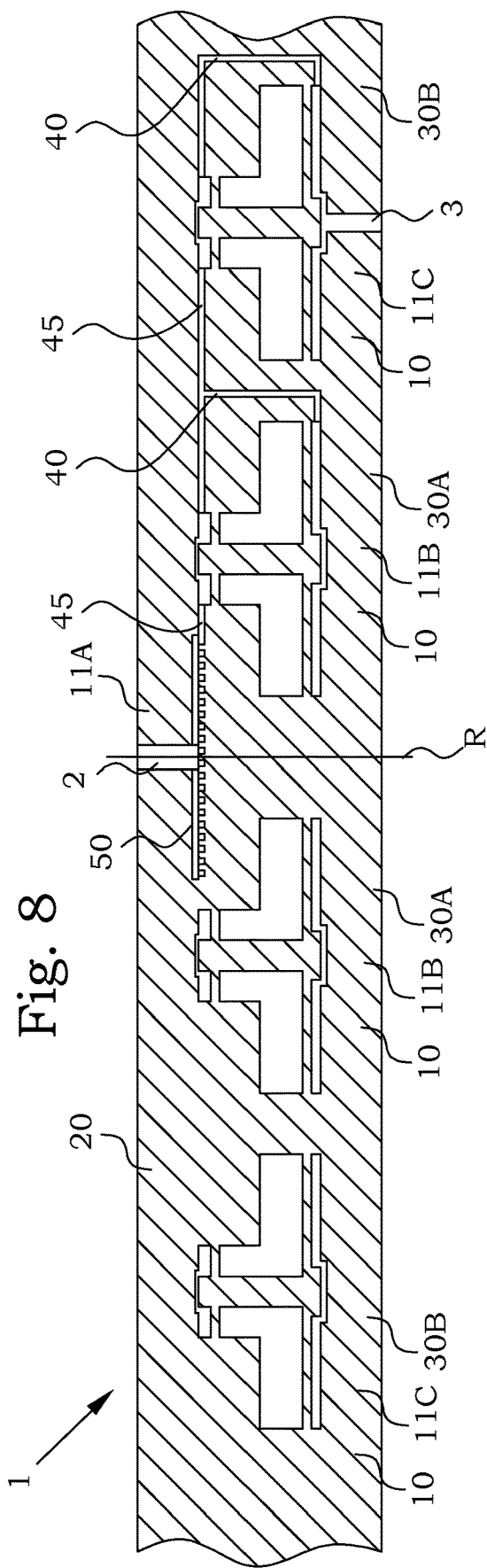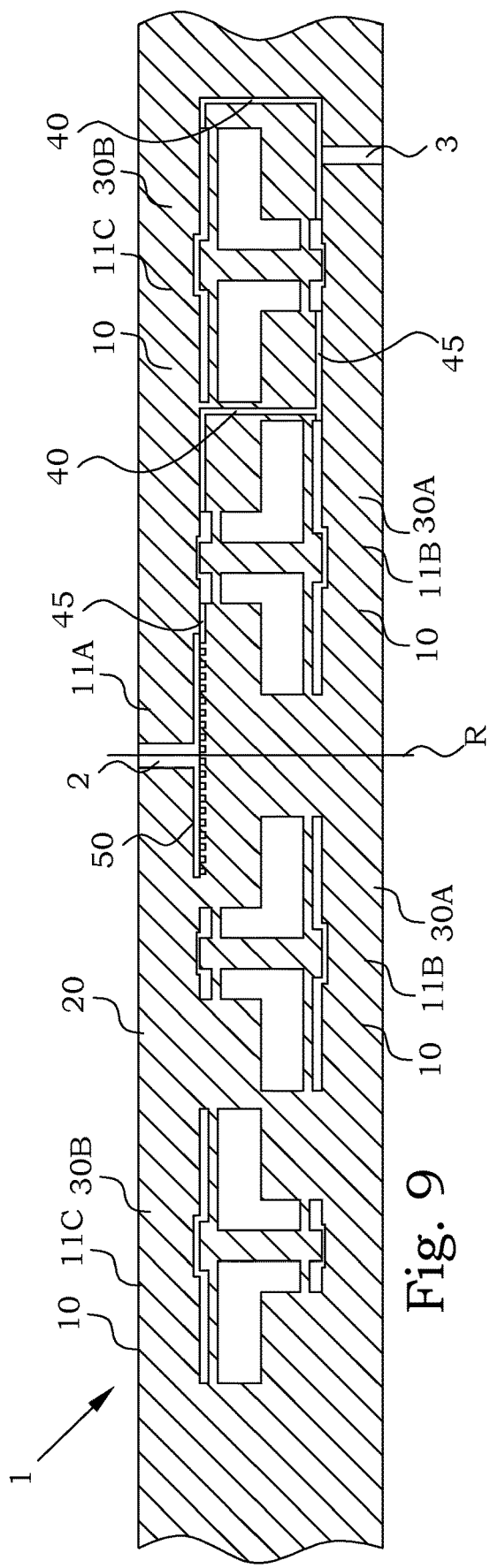

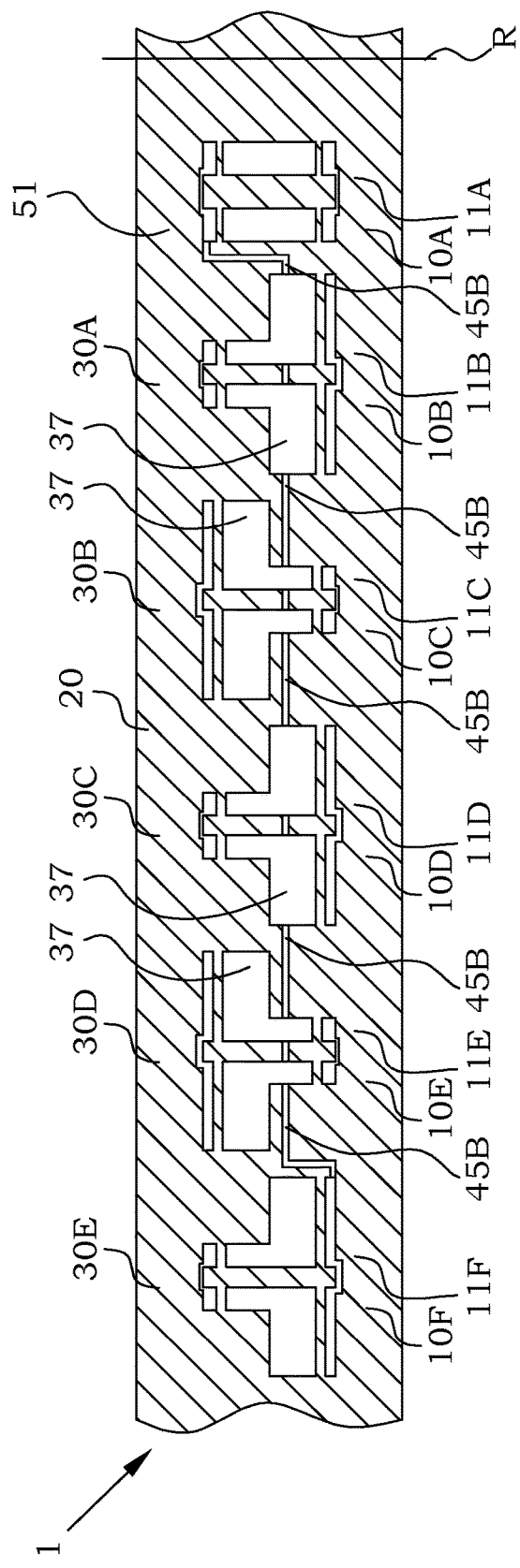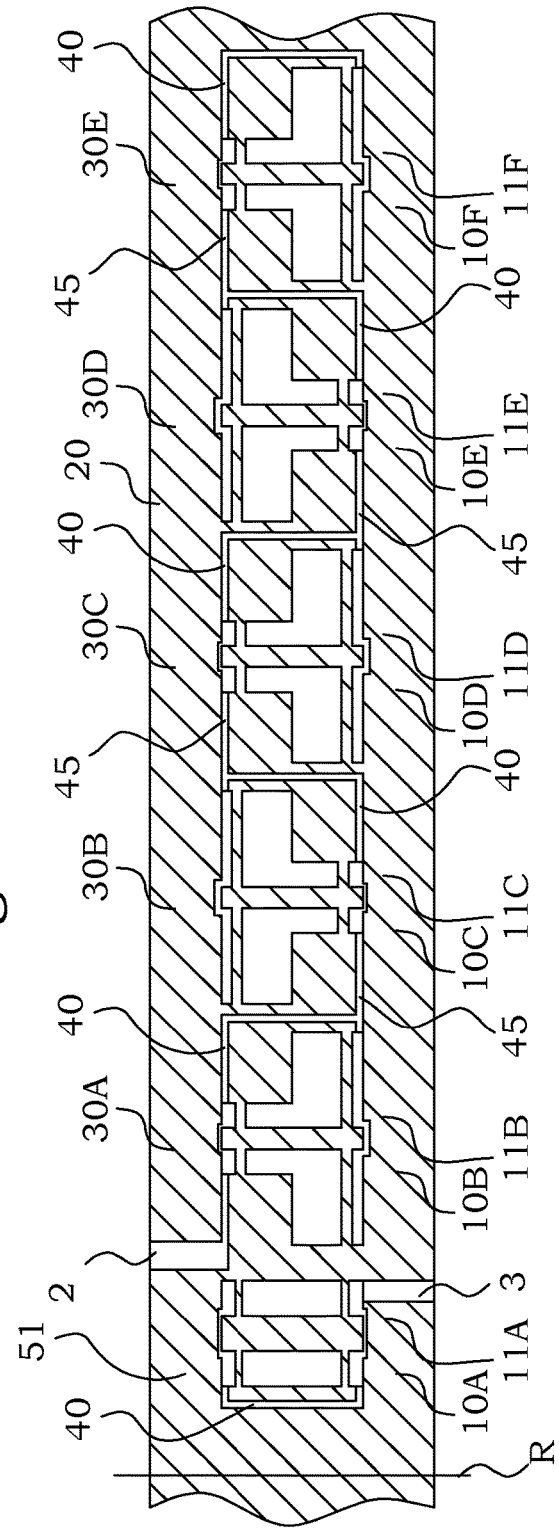
Fig. 12A

MICRO-ELECTRO-MECHANICAL SYSTEM FLUID CONTROL

CROSS-REFERENCE TO RELATED APPLICATIONS

The present application is based on PCT filing PCT/EP2022/066267, filed Jun. 15, 2022, which claims priority from Swedish Patent Application No. 2150773-6, filed Jun. 16, 2021, the entire contents of each are incorporated herein by reference.

TECHNICAL FIELD

The present technology refers in general to fluid control systems and in particular to fluid control systems realized as micro-electro-mechanical systems.

BACKGROUND

Micro-electro-mechanical systems (MEMS) are today used for realizing many different kinds of microactuators or microsensors in a cost efficient and space-saving way. One often used application for MEMS is as microfluid control devices. A review of different microfluid applications may e.g. be found in the article "A review of Passive Constant Flow Regulators for Microfluidic Applications" by E. Chappel, in Applied Sciences 2020, 10, 8858, Dec. 10, 2020.

A common strive for such MEMS applications is to make the fluid control devices as small as possible and easy to manufacture. MEMS are typically based on mechanically worked wafers that are bonded together as a unit. In that respect, it is a general rule that the number of wafers needed for achieving a fluid control operation is a crucial parameter. The more wafers that are needed, the more difficult the bonding becomes. A general trend is thus to minimize the requested number of wafers.

A typical fluid control device comprises a number of flow components. Such flow components may e.g. be fluid-control components, such as filters, valves, regulators etc., and/or fluid-monitor components, such as pressure sensors, flow sensors etc. Such flow components are fluidly connected in serial and/or in parallel in different configurations in order to achieve the requested allover flow functionality.

One example of a fluid control device is a pressure regulator, designed for providing a constant stream of low-pressure gas from a high-pressure storage tank. Many solutions are proposed, but most of them involve a number of flow components, e.g. a number of pressure reduction stages.

However, when the need for more flow components increases, there is a problem of how to geometrically position the flow components with respect to each other for achieving a total configuration that is easy to manufacture. Stacking flow components in the thickness direction of a MEMS is perhaps the conceptually easiest solution, however, as was indicated above, the bonding complexity increases tremendously with increasing number of requested wafers.

An alternative way is to position the flow components side by side in the main plane of the wafers. However, also here, the increasing number of flow components will cause the entire fluid control device to present a relatively large extension in the plane of the wafers. This generally increases the production costs and may also e.g. cause mechanical strength problems.

In the published U.S. Pat. No. 5,839,467, micromachined fluid handling devices are disclosed. Different membrane-comprising components are positioned side-by-side.

In the published patent application US 2017/01762677 A1, a pressure sensor chip is disclosed. A high-differential-pressure diaphragm is positioned at a same surface and side-by-side with a number of low-differential-pressure diaphragms.

In the article "A micro chemical analyzing system integrated on a silicon wafer", by S. Nakagawa et al, 19900211-19900214, 11 Feb. 1990, pages 89-94, XP010002991, the fabrication of a three-way valve on a silicon wafer by micromachining techniques is disclosed.

A further alterative way is to try to integrate more than one specific functionality in each flow component, in order to reduce the number of flow components. However, such an approach often requires considerable construction efforts and may typically lead to solutions that are very application specific. Such an approach is therefore often slow and costly.

SUMMARY

A general object of the presently presented technology is to find new concepts for configuring fluid control devices which are easy and cheap to develop and manufacture, and in particular for fluid control devices requiring many steps or components.

The above object is achieved by methods and devices according to the independent claims. Preferred embodiments are defined in dependent claims.

In general words, in a first aspect, a fluid-control device comprises a stack of wafers in which flow components are provided as micro-electro-mechanical systems-MEMS. The flow components are selected from fluid-control components and/or fluid-monitor components. The fluid-control device has a first flow component that is encircled, in a main plane of the stack of wafers, by a second flow component. At least the first and second flow components comprise a respective deformable membrane.

One advantage with the proposed technology is that the extension of the fluid-control device in the main plane of the stack of wafers can be kept small. Other advantages will be appreciated when reading the detailed description.

BRIEF DESCRIPTION OF THE DRAWINGS

The invention, together with further objects and advantages thereof, may best be understood by making reference to the following description taken together with the accompanying drawings, in which:

FIG. 6 is a schematic cross-sectional view of yet an embodiment of a MEMS flow control device having two pressure regulators;

FIG. 7 is a schematic cross-sectional view of yet an embodiment of a MEMS flow control device having two pressure regulators;

FIG. 8 is a schematic cross-sectional view of an embodiment of a MEMS flow control device having two pressure regulator and a filter;

FIG. 9 is a schematic cross-sectional view of another embodiment of a MEMS flow control device having two pressure regulator and a filter;

FIG. 12A illustrates schematically a cross-sectional view of an embodiment of a MEMS flow control device having five pressure regulator and a check valve;

DETAILED DESCRIPTION

Throughout the drawings, the same reference numbers are used for similar or corresponding elements.

For a better understanding of the proposed technology, it may be useful to begin with a brief discussion of advantages and problems with MEMS arrangements. As was briefly mentioned in the background, MEMS is very advantageously used for providing single flow components. However, the problems arises when requests for more complex systems are made. Using a MEMS stack of wafers based on two or three wafers bonded together is relatively easy and may be considered as standard procedures. Already four-wafer stacks create additional complexity and may be considered as non-standard procedures. Five-wafer stacks become much more difficult to handle, but may still be feasible with large efforts. Wafer stacks with more than five wafers have to be considered as advanced special-effect manufacturing, at least with the techniques available today. For this reason, much of the MEMS-related work is thus spent on finding designs suitable for low-wafer-number MEMS stacks.

As a model system in this disclosure, a pressure regulator system can be used. There are many applications where it is necessary to regulate a gas pressure from a high storage tank to a lower operating pressure. It is sufficient in many applications that the regulator delivers a constant output pressure, whilst other applications require the possibility to vary the outlet pressure. The regulator is either passive or active. The active pressure regulator requires energy to monitor the pressure reading from a sensor and adjust the position of a valve to achieve the desired pressure. A passive regulator usually relies on tension in a membrane or a spring to regulate the pressure. This does not require any energy supplied from outside and are preferred in many applications.

Figure 1:
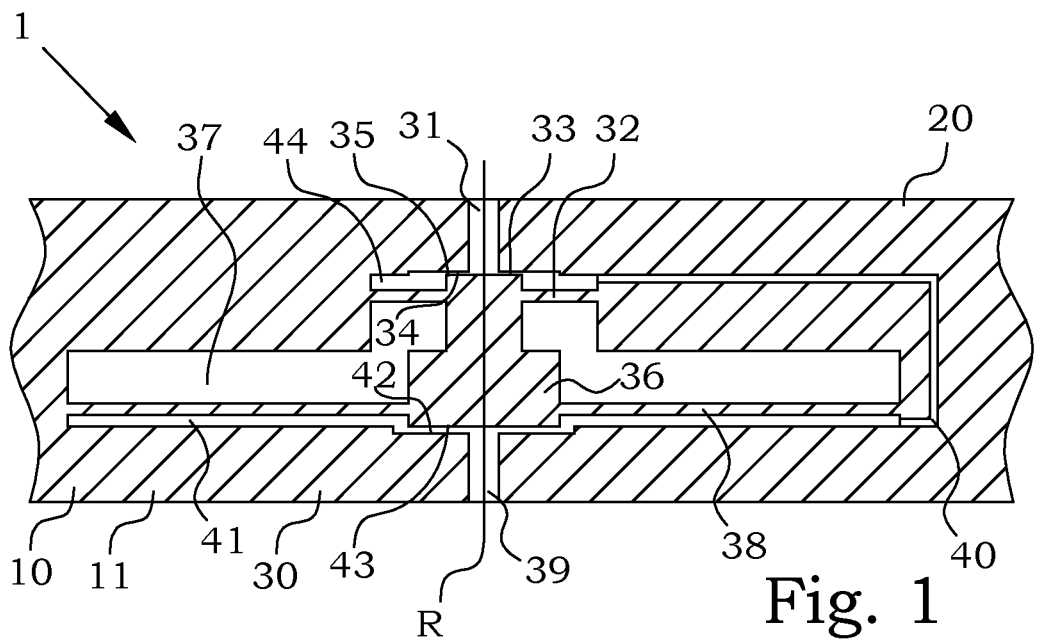
FIG. 1 is a schematic cross-sectional view of an embodiment of a prior art MEMS pressure regulator.

FIG. 1 illustrates schematically an embodiment of a prior art fluid control device 1, not literally covered by the present patent claims. This embodiment presents a flow component 10, in this case a fluid control component 11 and in particular a pressure regulator 30. The fluid control device 1 is provided with MEMS technology, and is therefore created by structures in a stack of wafers 20. In this design, a balance between a high-pressure membrane 32 having a small area and a regulated-pressure membrane 38 having a large area is utilized.

In this embodiment, a regulator inlet 31 allows gas of a high pressure to come into contact with a high-pressure membrane sealing surface. There is a narrow flow path 33 between the high-pressure membrane sealing surface 35 and a seat arrangement 34. The gas flows into a connect channel 40 via a high-pressure side volume 44, which is in contact with one side of the high-pressure membrane 32, and finally through a regulator outlet 39. The narrow flow path 33 constitutes a flow restriction and the gas in the high-pressure side volume 44 and the connect channel 40 has therefore a reduced regulated pressure. This gas with regulated pressure is allowed to fluidly communicate with a regulated-pressure cavity 41 being in contact with one side of a regulated-pressure membrane 38. The regulated-pressure membrane 38 and the high-pressure membrane 32 are connected by a piston arrangement 36, surrounded by a reference-pressure chamber 37. If the pressure in the outgoing pressure cavity 41 is higher than in the reference-pressure chamber 37, the regulated-pressure membrane 38 will tend to bend upwards in the figure and push the piston arrangement 36 upwards. However, the pressure difference between the high-pressure side volume 44 and the reference-pressure chamber 37 will tend to push the piston arrangement 36 downwards, but since the area of the high-pressure membrane is much smaller than the area of the regulated-pressure membrane 38, a net force on the piston arrangement 36 directed upwards in the figure will be the result. The high pressure acting on the centre part of the high-pressure membrane sealing surface 35 will also assist in pushing the piston arrangement 36 downwards. If the upwards directed forces dominate, the high-pressure membrane sealing surface 35 will be urged to close the narrow flow path 33 between the high-pressure membrane sealing surface 35 and a seat arrangement 34.

There will thus be a balancing action between the gas flowing through the narrow flow path 33, thereby building up the regulated pressure, and pressure in the regulated pressure cavity 41 trying to move the piston arrangement 36 upwards in the figure to close the narrow flow path 33. If the flow out from the regulator outlet 39 is stopped or restricted, the regulated pressure builds up until the narrow flow path 33 is closed. The increased regulated pressure will also act on the outer part of the high-pressure membrane 32, but since the area of the regulated-pressure membrane 38 that is in contact with the increased regulated pressure typically is larger, a net force will act to close the narrow flow path 33. When the flow out from the regulator outlet 39 is admitted again, the regulated pressure drops and the narrow flow path 33 is allowed to open.

For restricting the movement of the piston arrangement 36, a regulated-pressure membrane support surface 43 is arranged to be stopped by a low-pressure support structure 42. Rotation symmetry, as indicated by the line R, applies for all members except for the connect channel 40, which instead may occur as one or a plurality of separate channels distributed around the central structure.

Critical dimensions of the pressure regulator 30 are the radius of the high-pressure membrane 32, the radius of the regulated-pressure membrane 38, and the valve gap of the narrow flow path 33.

If a moderate pressure difference is requested for the pressure regulator, in particular for moderate pressures, the above concept may be designed to operate almost with a constant output flow independent on the original pressure, since the high-pressure contribution to the displacement of the piston typically is small. However, if a high pressure reduction and/or a high input pressure is required, the level of the original high-pressure becomes more important for determining the final output flow. Therefore, in many applications, it is requested to use a two-stage pressure reduction, or even a multi-stage pressure reduction, where pressure regulators are provided in series, reducing the pressure in two or more steps.

Figure 2:
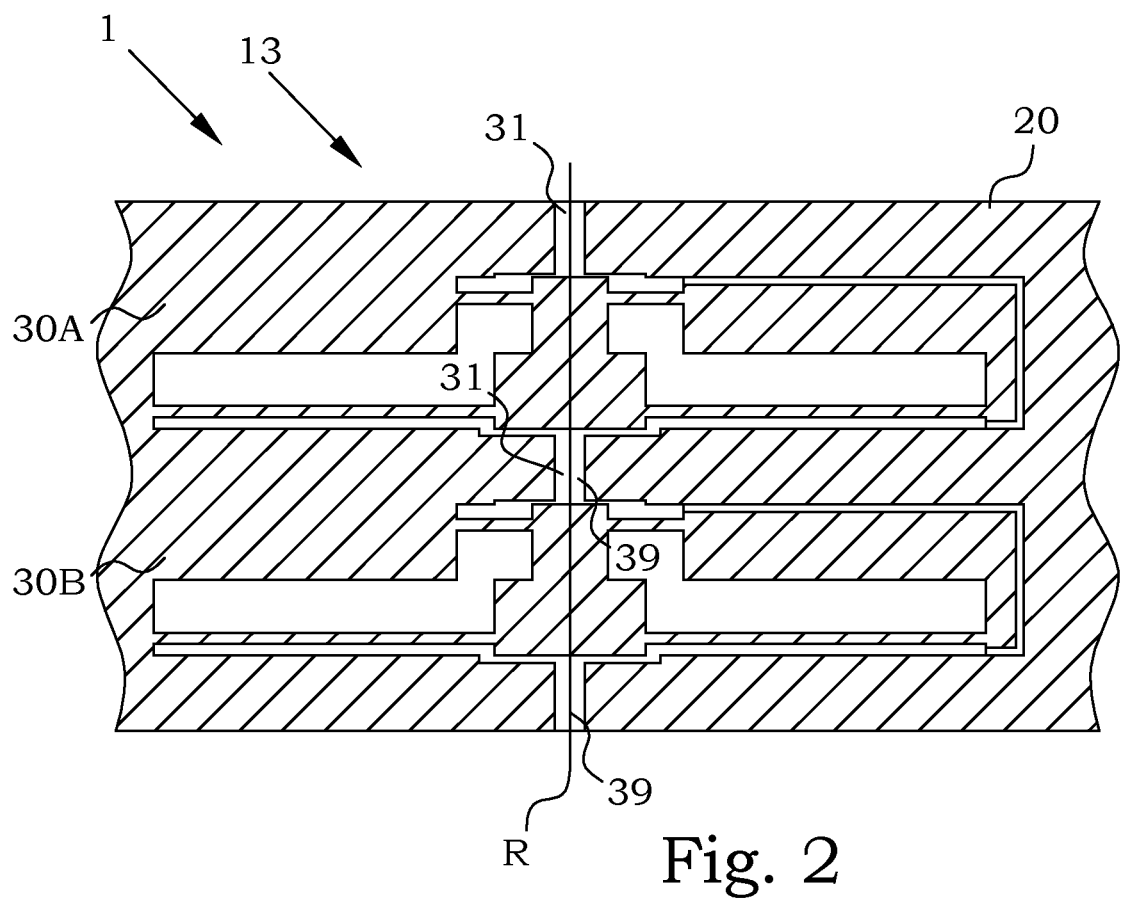
FIG. 2 is a schematic cross-sectional view of an embodiment of a prior art MEMS flow control device having two pressure regulators.

One embodiment of a design of a prior art two-stage MEMS pressure regulator assembly 13, not literally covered by the present patent claims, is illustrated in FIG. 2. Here, the regulator outlet 39 of a first pressure regulator 30A is connected to a regulator inlet 31 of a second pressure regulator 30B. However, it is immediately realized that such a design requests the use of many wafers to be bonded together into the stack of wafers 20. The manufacturing of such devices will therefore be extremely difficult, even if it is possible.

Figure 3:
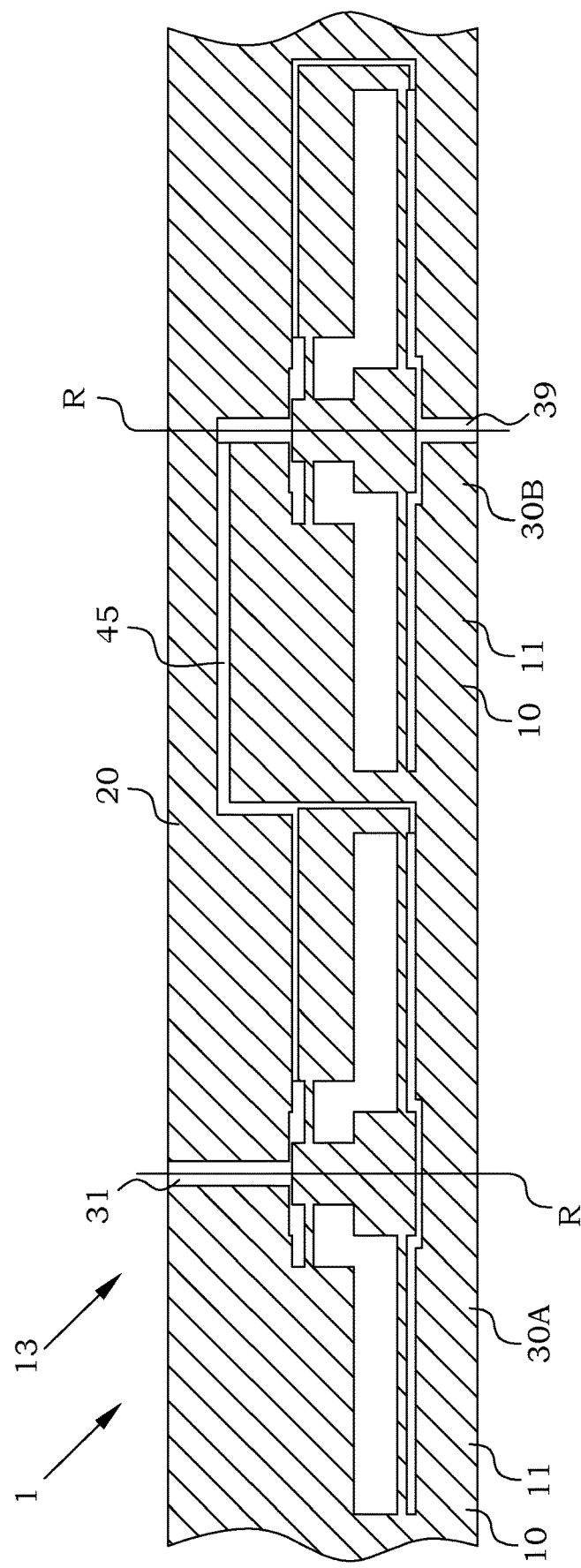
FIG. 3 is a schematic cross-sectional view of another embodiment of a prior art MEMS flow control device having two pressure regulators.

Another embodiment of a design of a prior art two-stage MEMS pressure regulator assembly 13, not literally covered by the present patent claims, is illustrated in FIG. 3. Here the pressure regulators 30A and 30B are still provided in a serial manner, fluidly seen. Each regulator 30A, 30B has its own rotational symmetry around the respective line R, except for the a few connection passages. However, physically, the regulators are placed side by side in the stack of wafers 20. This reduces the required number of wafers in the stack, and it is presently believed that only one additional wafer is needed compared to a single pressure regulator due to a connection passage 45 between the pressure regulators 30A and 30B. However, the lateral occupied space is doubled compared to a single pressure regulator. This embodiment is thus more attractive, however, in the view of that further flow components, both fluid control components, e.g. additional pressure reduction steps, valves or filters, and fluid monitoring components, e.g. pressure of flow sensors, may be required in different applications, the lateral extension of the total system may be inconveniently large.

Figure 4:
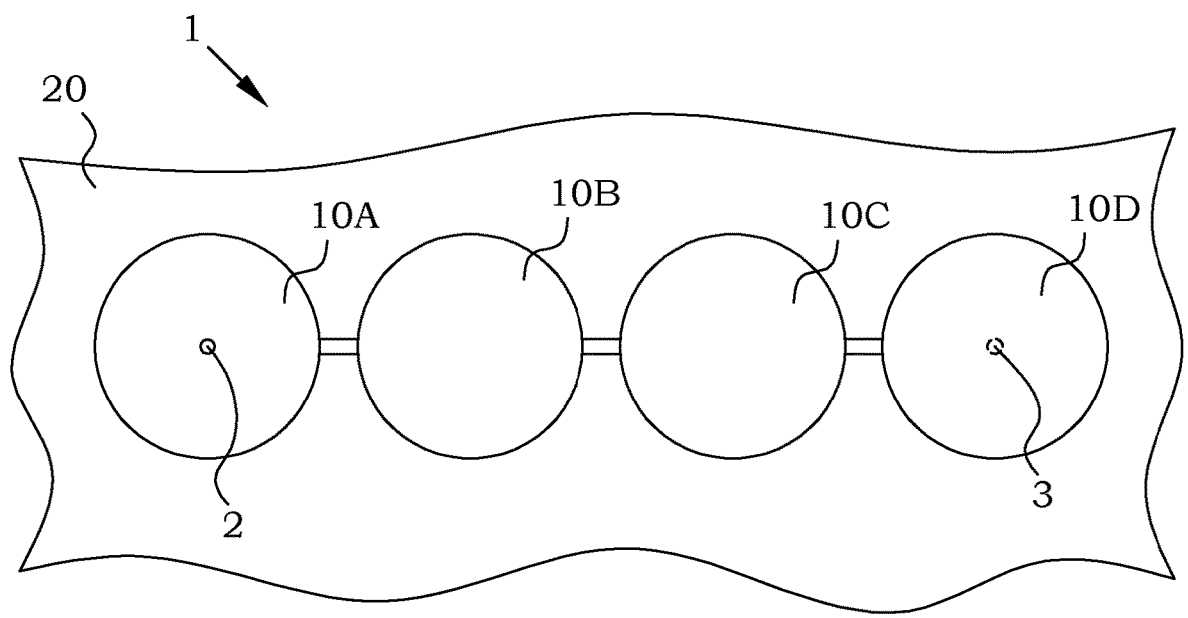
FIG. 4 is a schematic illustration of placing flow components side by side, not literally covered by the present patent claims.

Most flow components, at least flow components based on operation of membranes, have a circular symmetry. FIG. 4 illustrates schematically a fluid control device 1, not literally covered by the present patent claims, with a main inlet 2 to a first flow component 10A. This is illustrated, showing a main plane of the stack of wafers 20, i.e. perpendicular to the extension plane of the wafers used for creating the MEMS. Subsequent flow components 10B-D are then connected in series until a main outlet 3 (at the back side of the stack of wafers 20) is reached. The geometrical dimensions of such a design become much larger than for a single flow components design.

According to the present technology, however, it has been concluded that flow components, also membrane-based flow components, are possible to design with a circular geometry, but with a "passive" central part. That is, the active structures may be designed within a space defined by an inner and an outer radius. In other words, the active structures do not have to reach all the way into the centre of the circularly symmetric geometry. The space around the symmetry axis does not necessarily be used.

Figure 5:
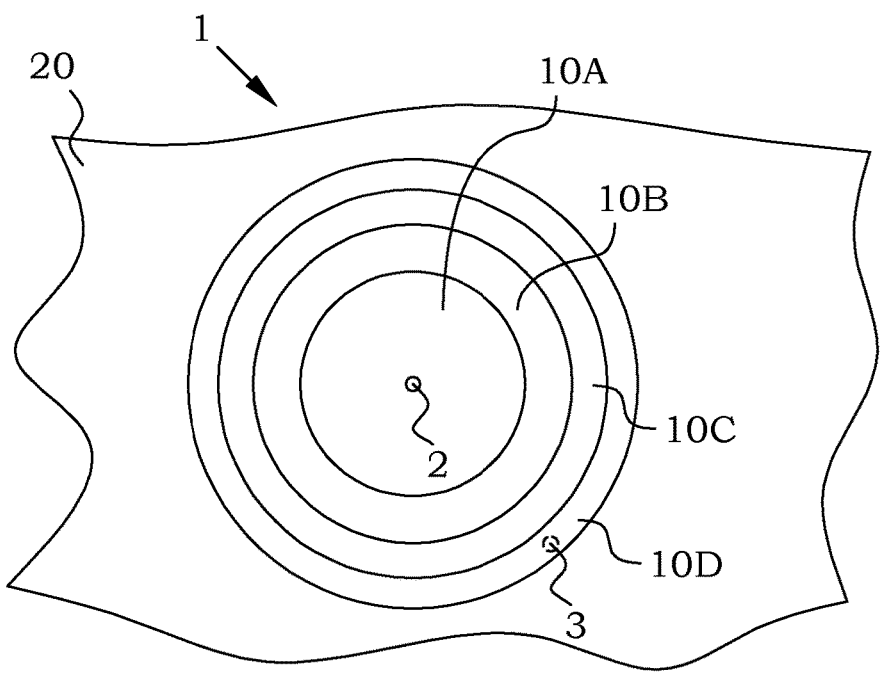
FIG. 5 is a schematic illustration of placing flow components encircling each other.

This insight opens up for a new concept of designing flow control devices with more than one flow component. FIG. 5 is a schematic illustration of an embodiment of a fluid control device 1, similar in function to the one illustrated in FIG. 4. This is also illustrated, showing a main plane of the stack of wafers 20. Here, a first flow component 10A is provided in the middle. Around this first flow component 10A, a second flow component 10B is provided. The active area of flow component 10B is equal to the active area of flow components 10A, but since it is provided at a larger radius, the width of the active area is smaller. The flow components 10A and 10B thereby utilize the available areas more efficiently, increasing the density of actively utilized area portions. Two more flow components 10C and 10D are then provided concentrically outside the inner ones. In case the flow components involve a deformable membrane, all flow components, except possible the most inner one, utilized ring-shaped membranes. The ring shape is in the illustration a circular ring. However, the ring shape may be of any closed geometry, e.g. elliptic or polygonal.

Even if the active area cannot be made too narrow, the space-saving obtained by placing the congruent flow components 10A-D concentrically outside each other is obvious. An outer flow component encircles an inner flow component. In other words, an inner flow component is completely provided in an area that is entirely surrounded by an outer flow component. In many applications, the connection paths between the flow components can be provided within the existing wafer stack thickness and in such applications, no extra wafer is needed to ensure the connection paths.

Thus, in other words, in one embodiment, a fluid-control device, comprising a stack of wafers in which flow components are provided as MEMS, a first flow component is encircled, in a main plane of the stack of wafers, by a second flow component. Each of the flow components is either a fluid-control component or a fluid-monitor component.

In a further embodiment, a third flow component encircles, in the main plane of the stack of wafers, the second flow component.

In yet a further embodiment, a fourth flow component encircles, in the main plane of the stack of wafers, the third flow component.

In a generalized embodiment, this can for any arbitrary number, n, of flow components be expressed as the fluid-control device having n flow components. A $k^{th}$ flow component encircles, in the main plane of the stack of wafers, a $(k-1)^{th}$ flow component, where k is an integer equal or less than n but larger than one. The number n may be larger than 4.

These ideas can by advantage be applied to the example application of pressure regulators.

FIG. 6 illustrates schematically a cross-section of an embodiment of a fluid-control device 1, in this embodiment a pressure regulator system. The fluid-control device 1 comprises two flow components 10, both of them being fluid-control components 11, and in particular a first pressure regulator 30A and a second pressure regulator 30B. Note that since the second pressure regulator 30B encircles the first pressure regulator 30A in the main plane of the stack of wafers 20, parts of the second pressure regulator 30B appear at both sides of the first regulator 30A in the figure. The first and second regulators 30A, 30B have a common symmetry axis R for most parts except the connect channels 40 between high and low pressure sides and the connection passage 45 between the regulators 30A, 30B. The fluid-control device 1 has a total radius that is smaller than a design with pressure regulators side by side and is possible to realize in the same number of wafers as a single pressure regulator.

The second pressure regulator 30B has thus a general cylindric shape, leaving the interior to be used for other purposes. In this case the first pressure regulator 30A occupies this volume and is thus encircled by the second pressure regulator 30B. In analogy with what was described above, and in common with other flow components, the second pressure regulator 30B comprises a deformable membrane. The second pressure regulator 30B has a high-pressure membrane 32 arranged for allowing a sealing action against a seat arrangement 34 when deformed.

The second pressure regulator 30B further has a regulated-pressure membrane 38 and a pressure-regulator flow path, comprising a connect channel 40, from a high-pressure inlet 61 passing between the high-pressure membrane 32 and the seat arrangement 34, i.e. through the narrow flow path 33, to a low-pressure outlet. A first side, facing downwards in the illustration, of the regulated-pressure membrane 38 is in fluid contact with the low-pressure outlet 62 of the pressure-regulator flow path.

The fluid contact between the above mentioned first side of the regulated-pressure membrane 38 and the low-pressure outlet 61 of the pressure-regulator flow path comprises an outgoing-pressure cavity 41. The outgoing-pressure cavity 41 is in contact with the regulated-pressure membrane 38. The second pressure regulator 30B, in analogy with the first pressure regulator 30A, has further a piston arrangement 36 connecting the high pressure membrane 32 and the regulated-pressure membrane 38. Thereby a reference-pressure chamber 37 is formed between the high-pressure membrane 32 and the regulated-pressure membrane 38, surrounding the piston arrangement 36. In other words, at least two flow components 10 comprise a respective deformable membrane 32, 38.

In FIG. 6, the first pressure regulator 30A was of a "conventional" type with circular symmetry having active portions all the way into the symmetry axis, while the second pressure regulator 30B instead has a cylinder shape, with an inactive center volume. The volume around the symmetry axis R is often useful for many other functions, and it might be advantageous to leave at least part of this volume unused. In other words, the components that are possible to implement with a cylindrical geometry may be placed further out, saving the volume in the center to components or connections that might require to be placed there. FIG. 7 illustrates schematically a cross-sectional view of such an embodiment. Here, both the first pressure regulator 30A and the second pressure regulator 30B are of a cylindrical type, leaving the respective interior volume unused.

In the above embodiments, at least one flow component is a fluid-control component. In a further embodiment, the fluid-control component is selected to be a pressure regulator, a valve or a filter.

In one embodiment, illustrated schematically by FIG. 8, a first fluid-control component 11A, in the function of a filter 50 is provided in the center volume of the stack of wafers 20 around the symmetry line R. A second fluid-control component 11B, in form of a first pressure regulator 30A is provided encircling the filter 50. A third fluid-control component 11C, in form of a second pressure regulator 30B is provided encircling the first pressure regulator 30A.

The embodiment of FIG. 8 thus comprising two pressure regulators 30A and 30B. The pressure regulators 30A, 30B have a high-pressure side and a low-pressure side. The high-pressure side of the two pressure regulators 30A, 30B are provided close to a first side of the fluid-control device 1.

FIG. 9 illustrates yet another embodiment of a fluid-control device 1. Here, the high-pressure side of the two pressure regulators 30A and 30B is provided in the proximity of opposite sides of the stack of wafers 20. In other words, the high-pressure side of one of the two pressure regulators and the low-pressure side of another of the two pressure regulators are provided close to a first side of the fluid-control device 1. Connect channels 40 between high and low pressure sides and the connection passage 45 between the regulators 30A, 30B can then be arranged differently, which makes the design more flexible.

Figure 10B:
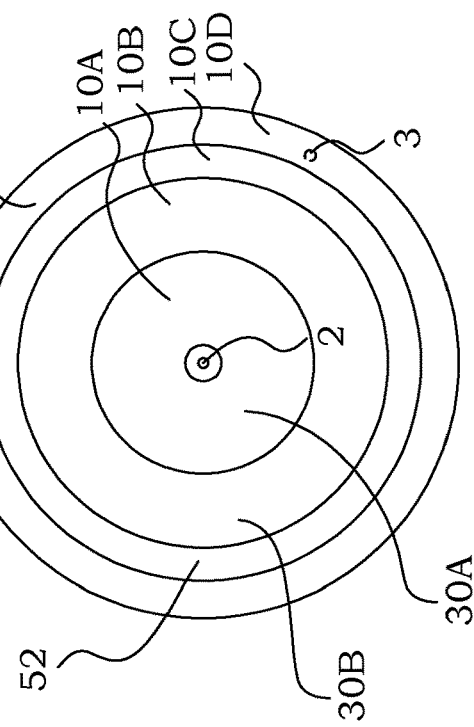
FIG. 10B is a schematic elevational view of the flow control device of FIG. 10A.
Figure 10A:
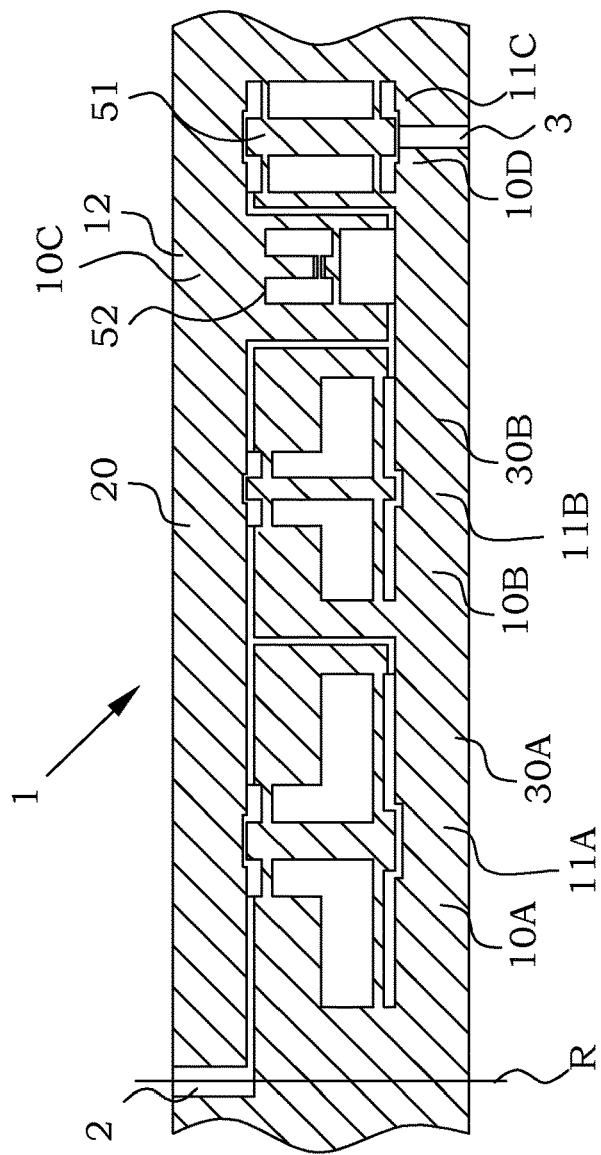
FIG. 10A is a schematic cross-sectional view of an embodiment of a MEMS flow control device having both fluid-control components and fluid-monitor components.

FIG. 10A illustrates another embodiment of a fluid-control device 1. Note here that only about half the device is illustrated and the symmetry line R is located far to the left in the figure. In this embodiment, the fluid-control device 1 comprises four flow components 10A-10D. Flow component 10A is a first fluid-control component 11A, in form of a first pressure regulator 30A. Flow component 10B is a second fluid-control component 11B, in form of a second pressure regulator 30B. Flow component 10C is a fluid-monitor component 12, in form of a pressure sensor 52. Flow component 10D is a third fluid-control component 11C, in form of a check valve 51.

FIG. 10B illustrates the extension of the flow components 10A-D of FIG. 10A in the main plane of the stack of wafers 10.

In one embodiment, at least one the flow components is a fluid-monitor component. In a further embodiment, that fluid-monitor component is selected to be a pressure sensor or a flow sensor.

In the figures, the main inlet and the main outlet are illustrated to be situated at opposite sides of the stack of wafers. This is the typical way of arranging a MEMS-based fluid-control devices, since it separates a gas volume before and after passing the fluid-control device by the stack of wafers itself. However, for particular applications, inlets and outlets at the same side of the stack of wafers may be beneficial, and the present technology is well adapted also for implementing such designs.

Any person skilled in the art realizes that the variations are in principle unlimited, and different flow components of various kinds may be positioned in a concentric circular geometry with respect to each other. In many applications, different flow components are fluidly connected in series, as was the case in the above embodiments. However, there are also possibilities to design fluid-control devices with parallel branches.

For serially fluidly connected flow components, it is often convenient to place them also as geometrically adjacent flow components. This was e.g. the case for the above presented embodiment. However, as will be the case in some embodiments further below, in some applications, two or more of the serially fluidly connected flow components may be geometrically non-adjacent flow components. This may e.g. be the case where some flow components are more advantageously provided at a small radius, or more advantageously provided at a large radius, than other flow components in the same device.

Figure 11A:
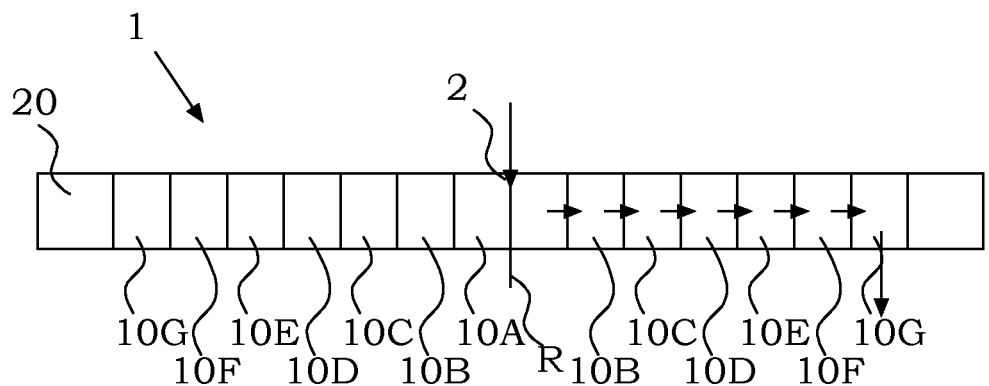
FIGS. 11A-C schematically illustrates different flow paths through a series of flow components.

FIG. 11A is a schematic illustration of an embodiment of a stack of wafers 20 of a fluid-control device 1. A number of flow components 10A-10G are provided enclosing each other around the symmetry axis R. Arrows are illustrating the fluid connections between the different flow components. It can here be seen that the flow starts to enter into the center flow component 10A and then successively continues out through the cylinder-shaped flow components 10B-10G and finally exits from flow component 10G.

In the embodiment of FIG. 11A, a high-pressure inlet, i.e. the main inlet 2, to the fluid-control device 1 is centered with respect to the first flow component 10A.

A high-pressure inlet to the fluid-control device 1 is here fluidly connected to an inlet of the first flow component 10A.

Figure 11B:
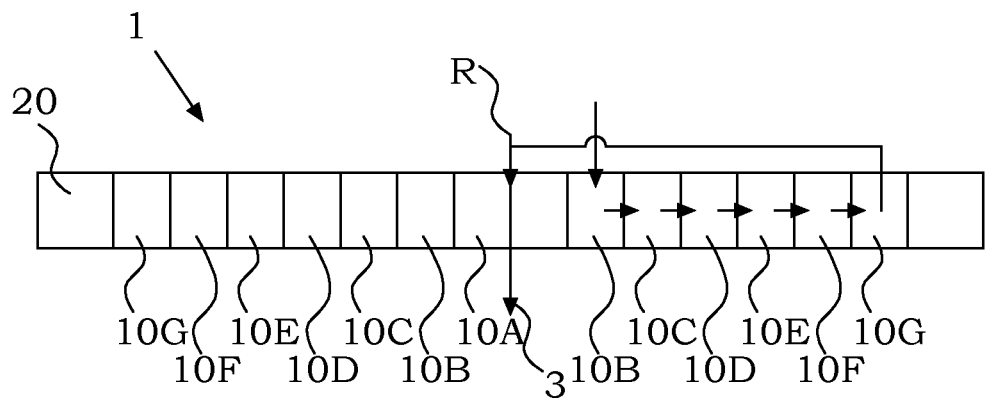

In FIG. 11B, a similar illustration of another embodiment is shown. Here the flow starts in flow component 10B, continues successively out to flow component 10G before the flow returns to the center flow component 10A, from which it finally exits.

In this embodiment, a low-pressure outlet, i.e. the main outlet 3, from the fluid-control device is centered with respect to the first flow component 10A.

A low-pressure outlet from the fluid-control device 1 is here fluidly connected to an outlet of the first flow component 10A.

In an alternative embodiment, the actual high-pressure inlet may also be provided within the volume of the first flow component 10A, however, being connected to the flow component 10B as a first active component.

Figure 11C:
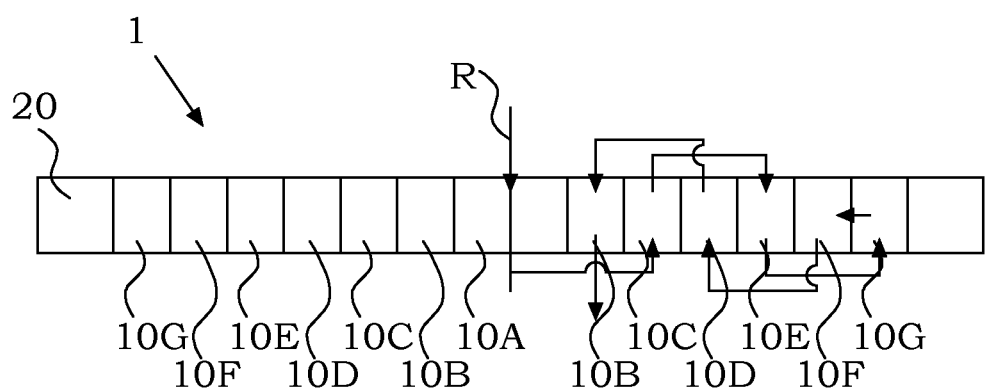

In FIG. 11C, an even more irregular embodiment is illustrated. Here, the fluid connection is made to the neighbouring flow component only between flow components 10G and 10F. Most of the serially fluidly connected flow components are geometrically non-adjacent flow components.

Fluid connection of flow components in a geometrically non-neighbouring order may be provided for by adding one or more wafers to the stack of wafers. However, in certain applications, other solutions may also be possible.

FIG. 12A illustrates an embodiment of a fluid-control device 1 having five pressure regulators 30A-30E and a check valve 51. The figure is split into two parts, where the left part is illustrated at the top and the right part at the bottom. In this embodiment, the geometrical order of the flow components 10A-F starts from the center and goes outwards. However, the main inlet 2, or rather main inlets 2, is connected to the first pressure regulator 30A, i.e. flow component 10B. The fluid connection is then in the order of 10B, 10C, 10D, 10E, 10F and 10A, concerning the numbering of the flow components, which corresponds to the pressure regulator 30A, 30B, 30C, 30D, 30E and finally the check valve 51.

It has been found that pressure regulations of the order of 1:3 may readily be achieved in each stage of the five pressure regulators, and the pressure regulation may be even larger at lower absolute pressures. This means that a total pressure regulation of more than 250 times can be achieved by such an arrangement.

There is a connection passage 45B between the pressure regulator 30E and the check valve 51. This connection passage 45B is in this embodiment designed to pass through the reference-pressure chambers 37 of the pressure regulators 30A-D. The operation of the pressure regulators 30A-D will not be affected in any higher degree, since the pressure in the connection passage 45B in this embodiment is intended to be almost at atmospheric pressure and will not change very much during operation. However, this design saves the use of an additional wafer.

Figure 12B:
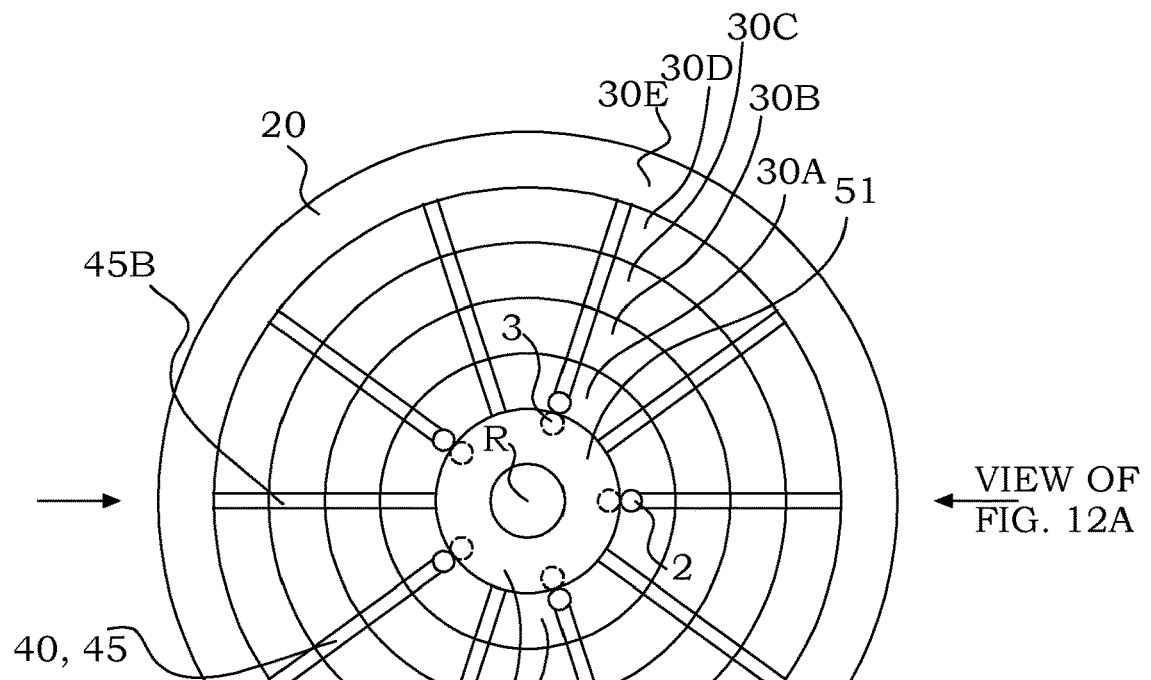
FIG. 12B is a schematic elevational view of the flow control device of FIG. 12A.

FIG. 12B is a schematic illustration of the lateral distribution of connection passages 45, connection passages 45B and connect channels 40 of FIG. 12A. In this embodiment, there are five instances of each connection passage and each connect channels for each flow component.

In other words, in one embodiment a fluid connection between two flow components passes through the reference pressure chamber.

The cylindrical geometry of the flow components may also influence the preferred details of the design. In the case of pressure regulators, it can be understood that if a piston arrangement is provided exactly half-way between the radially outer wall and the radially inner wall of the reference-pressure chamber, the area of the membranes radially outside the (cylindrical) piston is slightly larger than the area of the membranes radially inside the piston. The total force applied to the radially outer membrane area thereby becomes higher than the total force applied to the radially inner membrane area. Such uneven distribution of forces may be utilized in different applications, but may be unwanted in other.

This can, however, be mitigated by positioning the piston arrangement closer to a radially outer border of the high-pressure membrane or regulated-pressure membrane than to a radially inner border of the high-pressure membrane or regulated-pressure membrane, respectively. One preferred configuration is that an area of the regulated-pressure membrane situated at a radius less than a radius of the piston arrangement is equal to an area of the regulated-pressure membrane situated at a radius larger than a radius of the piston arrangement Another preferred configuration is that an area of the high-pressure membrane situated at a radius less than a radius of the piston arrangement is equal to an area of the high-pressure membrane situated at a radius larger than a radius of said piston arrangement.

Figure 13:
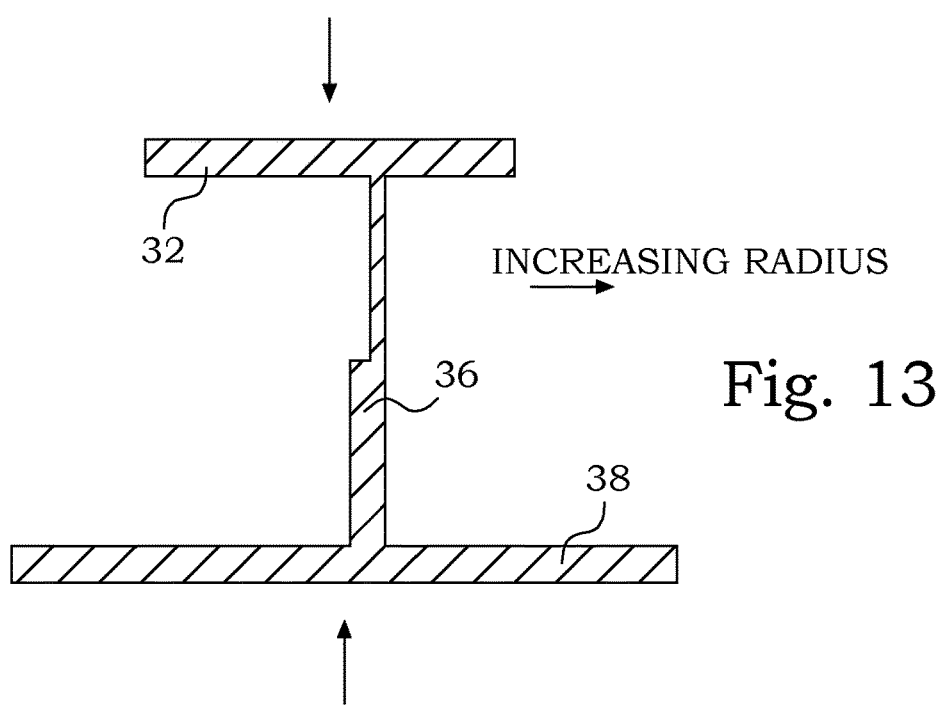
FIG. 13 illustrated a cross-sectional view of an embodiment of a piston arrangement.

FIG. 13 illustrates a part of a cross-section view of an embodiment of a piston arrangement 36, a high-pressure membrane 32 and a regulated-pressure membrane 38. The radius increases towards the right side in the figure. The middle points of the membranes are indicated with arrows. In this embodiment it may be noticed that the piston arrangement 36 does not have to attach to the membranes in the centre. The piston arrangement 36 to the high-pressure side must not have the same width as the piston arrangement 36 to the low-pressure side. This is another design parameter that may be used to fine tune the stiffness of the membranes. Furthermore, the different parts of a piston arrangement must not meet in their respective centre. In this particular embodiment, the high-pressure membrane 32 and the regulated-pressure membrane 38 have the same thickness. However, in alternative embodiments, they may have differing thicknesses. Also this is a design parameter to be used for achieving correct membrane stiffnesses.

In a particular embodiment, the piston arrangement is divided into a high-pressure piston part and a low-pressure piston part, which, under relaxed conditions, are separated by a small distance. This means that during operation, a small bending of the regulated-pressure membrane has to occur before the two parts actually come into mechanical contact. Operation-wise, this mean that the regulation of the high-pressure membrane is delayed somewhat.

Another detail of the pressure regulators that may be used for adapting the pressure drop is the design and dimensions of the seat arrangement and the high-pressure membrane sealing surface.

When high pressure reductions are to be handled, the forces on the piston arrangements, the high-pressure membrane and the seat arrangement may be considerable. In order to avoid deformation, the area of the seat arrangement that carries the load may be increased.

One further concern regarding the design of the seat arrangement is that debris particles sometimes follows with the gas stream and may be stuck between the seat arrangement and the high-pressure membrane sealing surface, which prohibits a complete closure of the narrow flow path in the pressure regulator. Use of a broader seat arrangement increases the risk of trapping particles between the seat arrangement and the high-pressure membrane sealing surface.

In one embodiment, designed for mitigate such risks, the seat arrangement comprises a plurality of seat surface loops separated by recesses. Thereby, each seat loop forms a closed structure against which the high-pressure membrane can form a seal. Even if particles are stuck between the high-pressure membrane sealing surface and one of the seat surface loops, the high-pressure membrane sealing surface may still be able to seal against other seat surface loops. Furthermore, the particles may also be pushed into the space between the seat surface loops. The plurality of seat surface loops also increases the total contact area, thereby still lowering the contact pressure.

Figure 14A:
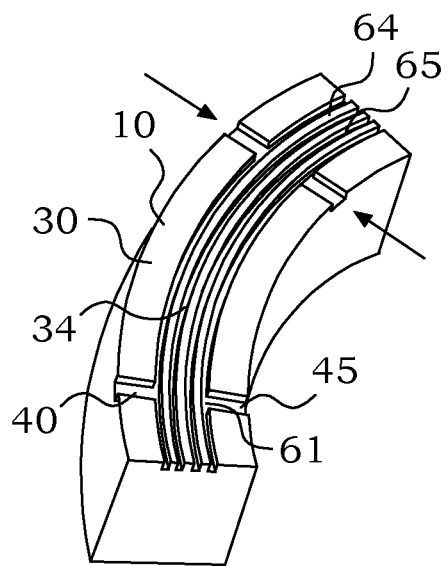
FIGS. 14A-C illustrate an embodiment of a seat arrangement.

FIG. 14A illustrates a part of a wafer intended to provide a seat arrangement for a pressure regulator 30. The seat arrangement 34 comprises a number of seat surface loops 64, separated by recesses 65. The seat surface loops 64 constitute full circles and are each thereby able to seal volumes on the inside from volumes on the outside with respect to the seat surface loops 64, connection passages 45 are provided at some angles and provide gas up to the innermost seat surface loop 64. Connect channel 40 are likewise provided outside the outermost seat surface loop 64. The number of seat surface loops 64 can be adapted to the properties and dimensions of the high-pressure membrane against which it is intended to provide a seal. The connect channels 40 do not necessarily be provided at the same angles as the connection passages 45. Furthermore, in alternative embodiments, the flow direction may be the opposite, i.e. that the connection passages 45 are provided at the outside and the connect channels 40 on the inside.

Figure 14B:
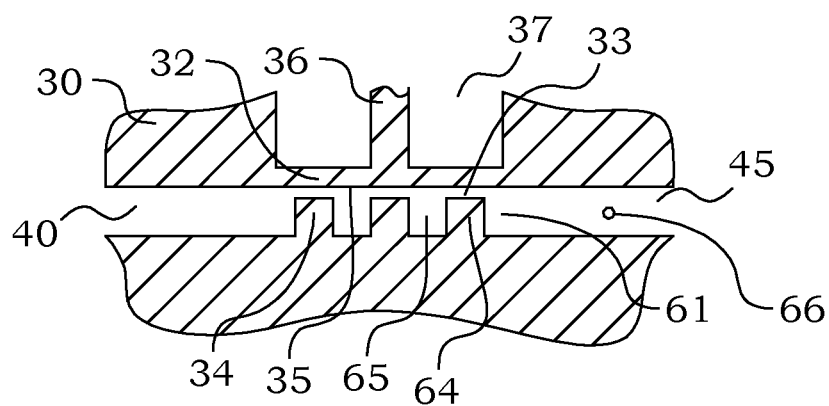
Figure 14C:
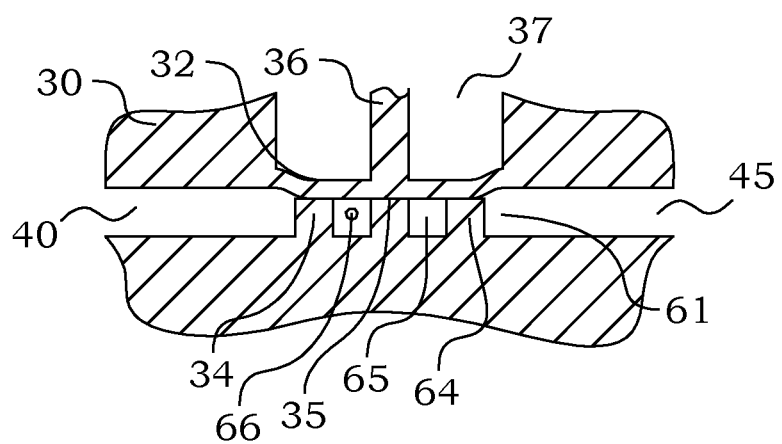

FIG. 14B illustrates a part of a cross-section view of an embodiment of a fluid control device 1 based on a structure such as illustrated in FIG. 14A. The cross-section is taken in the direction indicated by the arrows in FIG. 14A. The high-pressure membrane sealing surface 35 is provided facing the seat arrangement 34, with a narrow flow path 33 separating them. FIG. 14C illustrates a situation where a pressure difference over the high-pressure membrane 32 causes a deformation, thereby causing a contacting between the high-pressure membrane sealing surface 35 and the seat arrangement 34, thereby providing a sealing action. Note the schematic particle 66 that is trapped in a recess 65 and does not influence the sealing properties.

As mentioned further above, also the regulated-pressure membrane has preferably a solid structure to interact with. At high pressure differences between the pressure at the high-pressure membrane and the pressure at the regulated-pressure membrane, the regulated-pressure membrane may be deformed so much that it reaches the solid structure at the bottom of the regulated-pressure cavity. The membrane may then seal against this surface and the outgoing-pressure cavity will be unable to provide a correct pressure reference when the conditions are changed again. The regulated-pressure membrane may therefore be stuck to the regulated-pressure cavity. To solve this problem, the regulated-pressure cavity has preferably distance elements provided from a bottom of the cavity. These distance elements are configured to prohibit the regulated-pressure membrane to reach the bottom. At the same time, the distance elements allow gas to continuously flow within the regulated-pressure cavity, providing the correct pressure reference.

It is also beneficial to provide a stop position of the regulated-pressure membrane 67 without too large distortions, which otherwise may increase the risk for cracks in the membrane.

Figure 15A:
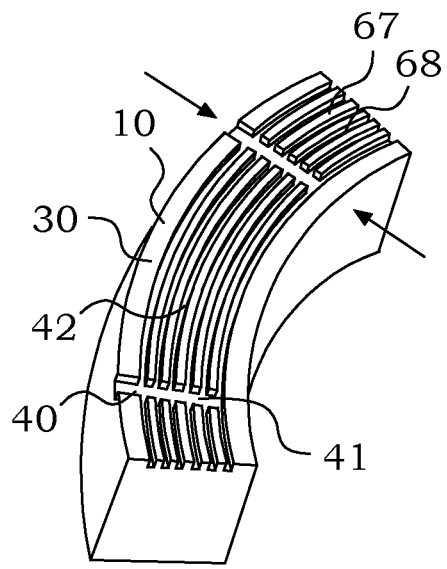
FIGS. 15A-C illustrate an embodiment of an arrangement of distance elements.

FIG. 15A illustrates schematically a part of a wafer intended to provide a low-pressure support structure 42 for a pressure regulator 30. A number of distance elements 67 are provided from the bottom 68 of the regulated-pressure cavity 41. The connect channel 40 serves for providing gas of a regulated pressure. In order to distribute the gas also when the regulated-pressure membrane is in contact with the distance elements 67, the distance elements are broken at some places and are, in contrary to the seat arrangement, not encircling the entire 360 degrees.

The distance elements 67 may be designed differently, e.g. as posts of different kinds of shapes. The distance elements 67 should be defined such that they offer a support for the regulated-pressure membrane at the same time as it allows gas to flow between the distance elements 67. A support presenting a less dense surface, i.e. more space between the supporting structures also contributes to ensure that a large area of the regulated-pressure membrane is available for the regulated pressure.

Figure 15B:
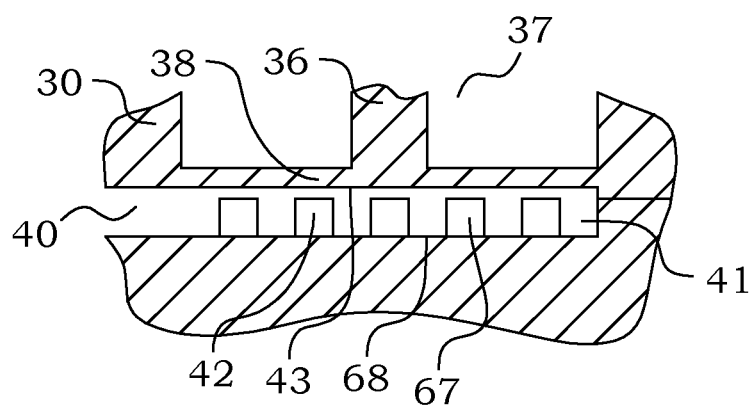
Figure 15C:
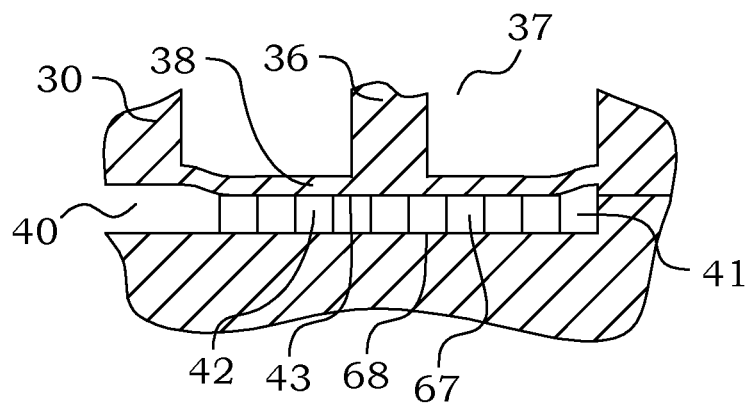

FIG. 15B illustrates a part of a cross-section view of an embodiment of a fluid control device 1 based on a structure such as illustrated in FIG. 15A. The cross-section is taken in the direction indicated by the arrows in FIG. 15A. Here, it can be seen that there is space for the gas between the individual distance elements 67. FIG. 15C illustrates a situation, where the regulated-pressure membrane 38 is deformed and is supporting against the distance elements 67. The regulated-pressure cavity 41 in contact with the regulated-pressure membrane 38 is still in fluid contact with the connect channel 40.

The embodiments described above are to be understood as a few illustrative examples of the present invention. It will be understood by those skilled in the art that various modifications, combinations and changes may be made to the embodiments without departing from the scope of the present invention. In particular, different part solutions in the different embodiments can be combined in other configurations, where technically possible. The scope of the present invention is, however, defined by the appended claims.

The invention claimed is:

1. A fluid-control device, comprising a stack of wafers in which flow components are provided as micro-electro-mechanical systems—MEMS, said flow components being selected from at least one of fluid-control components and fluid-monitor components, wherein a first said flow component is encircled, in a main plane of said stack of wafers, by a second said flow component, wherein
   at least two said flow components comprise a respective deformable membrane.

2. The fluid-control device according to claim 1, wherein a third said flow component encircles, in said main plane of said stack of wafers, said second said flow component.

3. The fluid-control device according to claim 2, wherein a fourth said flow component encircles, in said main plane of said stack of wafers, said third said flow component.

4. The fluid-control device according to claim 3, comprising n said flow components, where n is an integer larger than 4, wherein a $k^{th}$ said flow component encircles, in said main plane of said stack of wafers, a $(k-1)^{th}$ said flow component, where k is an integer equal or less than n but larger than one.

5. The fluid-control device according to claim 1, wherein at least two said flow components are fluidly connected in series.

6. The fluid-control device according to claim 5, wherein two of said serially fluidly connected flow components are geometrically adjacent flow components.

7. The fluid-control device according to claim 5, wherein two of said serially fluidly connected flow components are geometrically non-adjacent flow components.

8. The fluid-control device according to claim 1, wherein at least one said flow component is a fluid-control component.

9. The fluid-control device according to claim 8, wherein at least one said fluid-control component is selected from the group of:
pressure regulator;
valve; and
filter.

10. The fluid-control device according to claim 1, wherein at least one said flow component is a fluid-monitor component.

11. The fluid-control device according to claim 10, wherein at least one said fluid-monitor component is selected from the group of:
pressure sensor; and
flow sensor.

12. The fluid-control device according to claim 1, comprising at least one pressure regulator, said pressure regulator having a high-pressure membrane arranged for allowing a sealing action against a seat arrangement when deformed.

13. The fluid-control device according to claim 12, wherein said seat arrangement comprises a plurality of seat surface loops separated by recesses, whereby each seat surface loop forms a closed structure against which said high-pressure membrane can form a seal.

14. The fluid-control device according to claim 12, wherein said pressure regulator further having a regulated-pressure membrane and a pressure-regulator flow path comprising a connect channel from a high-pressure inlet passing between said high-pressure membrane and said seat arrangement to a low-pressure outlet; and wherein a first side of said regulated-pressure membrane is in fluid contact with said low-pressure outlet of said pressure-regulator flow path.

15. The fluid-control device according to claim 14, wherein said fluid contact between said first side of said regulated-pressure membrane and said low-pressure outlet of said pressure-regulator flow path comprises an outgoing-pressure cavity being in contact with said regulated-pressure membrane, wherein said outgoing-pressure cavity having distance elements provided from a bottom of said outgoing-pressure cavity, said distance elements being configured to prohibit said regulated-pressure membrane to reach said bottom.

16. The fluid-control device according to claim 14, wherein said pressure regulator further having a piston arrangement connecting said high pressure membrane and said regulated-pressure membrane, whereby a reference pressure chamber is formed between said high-pressure membrane and said regulated-pressure membrane, surrounding said piston arrangement.

17. The fluid-control device according to claim 16, wherein said piston arrangement is positioned closer to a radially outer border of said high-pressure membrane or regulated-pressure membrane than to a radially inner border of said high-pressure membrane or regulated-pressure membrane, respectively.

18. The fluid-control device according to claim 17, wherein at least one of:
an area of said regulated-pressure membrane situated at a radius less than a radius of said piston arrangement is equal to an area of said regulated-pressure membrane situated at a radius larger than a radius of said piston arrangement; and
an area of said high-pressure membrane situated at a radius less than a radius of said piston arrangement is equal to an area of said high-pressure membrane situated at a radius larger than a radius of said piston arrangement.

19. The fluid-control device according to claim 16, wherein a fluid connection between two flow components passes through said reference pressure chamber.

20. The fluid-control device according to claim 10, comprising at least two pressure regulators, said pressure regulators having a high-pressure side and a low-pressure side.

* * * * *